United States Patent [19]
Lin et al.

[11] Patent Number: 6,117,569
[45] Date of Patent: Sep. 12, 2000

[54] SPIN VALVES WITH ANTIFERROMAGNETIC EXCHANGE PINNING AND HIGH UNIAXIAL ANISOTROPY REFERENCE AND KEEPER LAYERS

[75] Inventors: Tsann Lin, Saratoga; Daniele Mauri, San Jose, both of Calif.

[73] Assignee: International Business Machines Corporation, Armonk, N.Y.

[21] Appl. No.: 09/085,687

[22] Filed: May 27, 1998

[51] Int. Cl.[7] .................................................... G11B 5/66
[52] U.S. Cl. ................ 428/692; 428/694 R; 428/694 T; 428/694 TS; 428/694 TM; 428/900; 427/128; 427/129; 427/130; 360/113; 338/32 R; 324/252; 204/192
[58] Field of Search ............................... 428/692, 694 R, 428/694 T, 694 TS, 694 TM, 900; 324/252; 360/113; 338/32 R; 427/128–130; 204/192.2

[56] References Cited

U.S. PATENT DOCUMENTS

| | | | |
|---|---|---|---|
| 5,159,513 | 10/1992 | Dieny et al. ............................ | 360/113 |
| 5,408,377 | 4/1995 | Gurney et al. .......................... | 360/113 |
| 5,508,867 | 4/1996 | Cain ....................................... | 360/113 |
| 5,528,440 | 6/1996 | Fontana et al. ........................ | 360/113 |
| 5,574,605 | 11/1996 | Baumgart et al. ...................... | 360/113 |
| 5,583,725 | 12/1996 | Coffey et al. .......................... | 360/113 |
| 5,648,885 | 7/1997 | Nishioka et al. ....................... | 360/113 |

OTHER PUBLICATIONS

Ishi, et al "Stress Induced Anisotropy . . . " IEEE Transactions in Magnetics. vol. 32, No. 5, Sep. 1996.
T. Ishi et al., "Stress Induced Anistropy Effect for SAL Films in Magnetoresistive Elements", IEEE Trans. on Mags., vol. 32, No. 5, Sep. 1996.

*Primary Examiner*—Leszek Kiliman
*Attorney, Agent, or Firm*—Paik Saber; William D. Gill

[57] ABSTRACT

An SV sensor having a reference (pinned) layer formed of a first high uniaxial anisotropy ferromagnetic material, such as Co—Fe, and a keeper layer formed of a second high uniaxial anisotropy ferromagnetic material, such as Ni—Fe—Nb. Lapping induced stress in the high positive magnetostriction Co—Fe layer generates a uniaxial anisotropy field in the pinned layer resulting in enhanced pinned layer magnetization. This uniaxial anisotropy field adds to the exchange field from an antiferromagnetic layer resulting in a substantially increased pinning field over the pinning field from the exhange interaction alone. The added uniaxial anisotropy field also improves the stability of the SV sensor at elevated temperatures since the uniaxial field is determined by a Curie temperature significantly higher than the blocking temperatures of antiferromagnetic materials. Lapping induced stress in the high positive magnetostriction Ni—Fe—Nb layer generates a uniaxial anisotropy field in the keeper layer providing more uniform magnetization and therefore better flux cancellation. The high electrical resistivity of the Ni—Fe—Nb keeper layer has the further benefit of reducing sense current shunting by the keeper layer.

30 Claims, 11 Drawing Sheets

SPIN VALVES WITH ANTIFERROMAGNETIC EXCHANGE PINNING AND HIGH UNIAXIAL ANISOTROPY REFERENCE AND KEEPER LAYERS

CROSS REFERENCE TO RELATED APPLICATION

U.S. patent application docket number SA9-97-187, entitled SPIN VALVES WITH HIGH UNIAXIAL ANISOTROPY REFERENCE AND KEEPER LAYERS, filed on May, 27, 1998, U.S. Ser. No. 09/085,981, owned by a common assignee and having the same inventors as the present invention.

BACKGROUND OF THE INVENTION

1. Field of the Invention

This invention relates generally to spin valve magnetoresistive sensors for reading information signals from a magnetic medium and, in particular, to a spin valve sensor with enhanced reference and keeper layer magnetizations due to stress induced uniaxial anisotropy.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR heads, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization of the MR element, which in turn causes a change in resistance of the MR element and a corresponding change in the sensed current or voltage.

Another type of MR sensor is the giant magnetoresistance (GMR) sensor manifesting the GMR effect. In GMR sensors, the resistance of the GMR sensor varies as a function of the spin-dependent transmission of the conduction electrons between ferromagnetic layers separated by a non-magnetic layer (spacer) and the accompanying spin-dependent scattering which takes place at the interface of the ferromagnetic and non-magnetic layers and within the ferromagnetic layers.

GMR sensors using only two layers of ferromagnetic material (e.g., Ni—Fe) separated by a layer of non-magnetic material (e.g., copper) are generally referred to as spin valve (SV) sensors. In an SV sensor, one of the ferromagnetic layers, referred to as the pinned layer (reference layer), has its magnetization typically pinned by exchange coupling with an antiferromagnetic (e.g., NiO or Fe—Mn) layer. The pinning field generated by the antiferromagnetic layer should be greater than demagnetizing fields (about 200 Oe) at the operating temperature of the SV sensor (about 120 C.) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). In the SV sensor, the GMR effect varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. IBM's U.S. Pat. No. 5,206,590 granted to Dieny et al., incorporated herein by reference, discloses a SV sensor operating on the basis of the GMR effect.

Figure 1A:
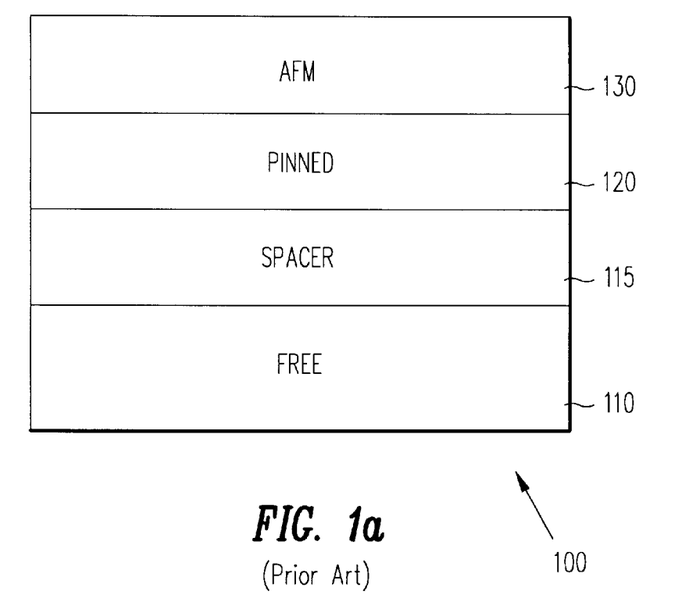
FIG. 1a is an air bearing surface view, not to scale, of a prior art SV sensor.

FIG. 1a shows a prior art SV sensor 100 comprising a free layer (free ferromagnetic layer) 110 separated from a pinned layer (pinned ferromagnetic layer) 120 by a non-magnetic, electrically-conducting spacer layer 115. The magnetization of the pinned layer 120 is fixed by an antiferromagnetic (AFM) layer 130.

Figure 1B:
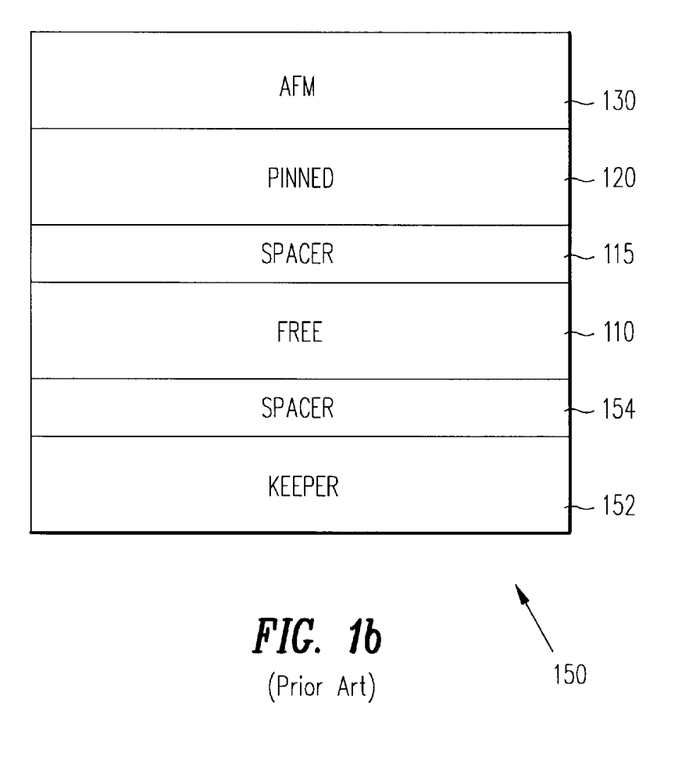
FIG. 1b is an air bearing surface view, not to scale, of a prior art keepered SV sensor.

FIG. 1b shows another prior art SV sensor 150 with a flux keepered configuration. The SV sensor 150 is substantially identical to the SV sensor 100 shown in FIG. 1a except for the addition of a keeper layer 152 formed of ferromagnetic material separated from the free layer 110 by a non-magnetic spacer layer 154. The keeper layer 152 provides a flux closure path for the magnetic field from the pinned layer 120 resulting in reduced magnetostatic interaction of the pinned layer 120 with the free layer 110. U.S. Pat. No. 5,508,867 granted to Cain et al., incorporated herein by reference, discloses an SV sensor having a flux keepered configuration.

Another type of SV sensor is an antiparallel (AP)-pinned SV sensor. In AP-Pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-Pinned SV sensor provides improved exchange coupling of the antiferromagnetic (AFM) layer to the laminated pinned layer structure than is achieved with the pinned layer structure of the SV sensor of FIG. 1a. This improved exchange coupling increases the stability of the AP-Pinned SV sensor at high temperatures which allows the use of corrosion resistant antiferromagnetic materials such as NiO for the AFM layer.

Figure 2A:
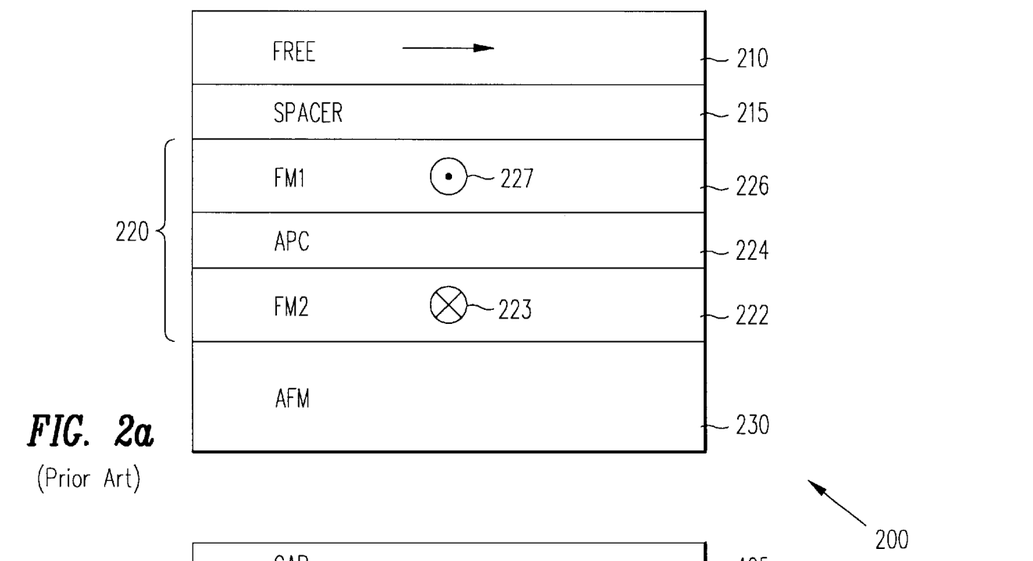
FIG. 2a is an air bearing surface view, not to scale, of a prior art AP-Pinned SV sensor.

Referring to FIG. 2a, an AP-Pinned SV sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 226 and a second ferromagnetic layer 222 separated by an antiparallel coupling (APC) layer 224 of nonmagnetic material. The two ferromagnetic layers 226, 222 (FW1 and FM2) in the laminated AP-pinned layer structure 220 have their magnetization directions oriented antiparallel, as indicated by the arrows 227, 223 (arrows pointing out of and into the plane of the paper respectively).

A key requirement for optimal operation of an SV sensor is that the pinned layer should be magnetically saturated perpendicular to the air bearing surface. Lack of magnetic saturation in the pinned layer leads to reduced signal or dynamic range. Factors leading to a loss of saturation include demagnetizing fields at the edge of the pinned layer, magnetic fields from recorded data and from longitudinal biasing regions, current induced fields and the coupling field to the free layer.

Figure 2B:
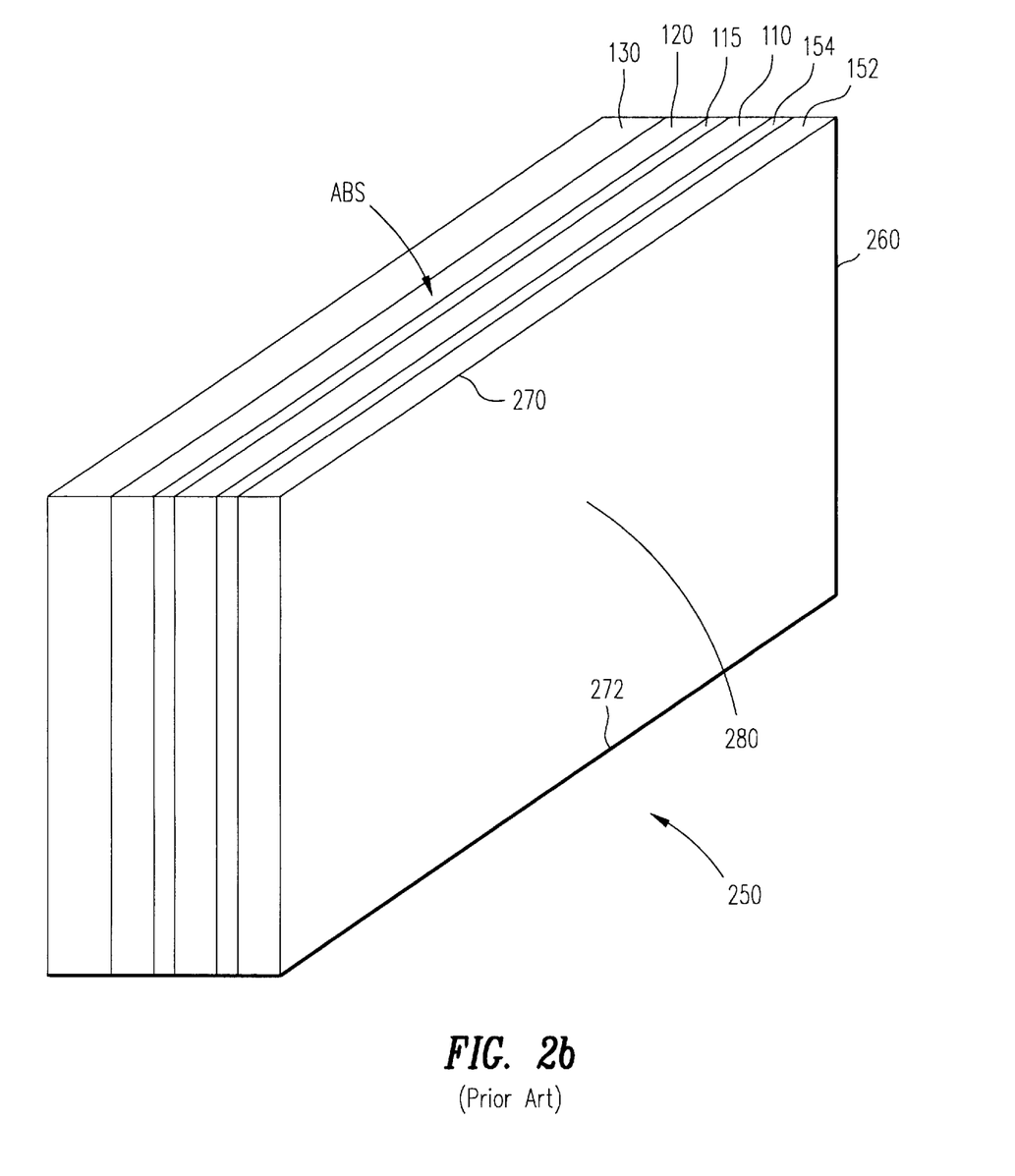
FIG. 2b is a perspective view, not to scale, of a prior art AP-Pinned SV sensor.

Analysis of the magnetic state of pinned layers in small sensors (a few microns or less in width), reveals that due primarily to the presence of large demagnetizing fields at the sensor edges the magnetization is not uniform over the area of the pinned layer. FIG. 2b shows a perspective view of an SV sensor 250. The SV sensor 250 is formed of a sensor stripe 260 having a front edge 270 at the ABS and extending away from the ABS to a rear edge 272. Due to the large demagnetizing fields at the front edge 270 and the rear edge 272 of the sensor stripe 260, the desired perpendicular magnetization direction is achieved only at the center portion 280 of the pinned layer stripe, while the magnetization tends to be curled into a direction parallel to the ABS at the edges of the stripe. The extent of these curled regions is controlled by the magnetic stiffness of the pinned layer.

Furthermore, prior art AP-Pinned SV sensors use an AFM in order to pin the pinned layer magnetization. Most commonly used AFM materials have blocking temperatures (temperature at which the pinning field reaches zero Oe) near 200° C. This means that if the temperature of the SV sensor approaches this temperature, the pinned layer magnetization can change its orientation resulting in degraded SV sensor performance.

Although AP-Pinned SV sensors have large effective pinning fields because near cancellation of the magnetic moments of the two sub-layers results in a low net magnetic moment for the pinned layer, thermal stability is still a concern because the operating temperatures of these SV sensors in disk files can exceed 120° C. In addition, the AP-pinned layer structure is vulnerable to demagnetization during processing operations such as lapping.

Therefore there is a need for an SV sensor that increases the magnetic saturation of the pinned layer and reduces the sensitivity to demagnetizing fields particularly at the front and rear edges of the pinned layer stripe. In SV sensors that include AFM layers to provide exchange anisotropy fields to fix the pinned layer magnetization direction, there is a further need for an SV structure that reduces the temperature limitations imposed by the blocking temperature characteristics of the commonly used antiferromagnetic materials required in prior art SV sensors for providing pinning fields.

SUMMARY OF THE INVENTION

It is an object of the present invention to disclose an SV sensor structure with an enhanced pinning field in the pinned layer structure.

It is another object of the present invention to disclose an SV sensor wherein the pinning field is enhanced by uniaxial anisotropy in the pinned layer structure.

It is a further object of the present invention to disclose an SV sensor wherein the pinning field is enhanced by use of a high magnetostriction material to form the pinned layer.

It is yet another object of the present invention to disclose a keepered SV sensor configuration wherein a keeper layer is formed using a high uniaxial anisotropy material.

It is a still further object of the present invention to disclose an AP-Pinned SV sensor wherein one or both of the ferromagnetic sublayers forming the AP-pinned layer structure are made of high uniaxial anisotropy materials.

In accordance with the principles of the present invention, there is disclosed a preferred embodiment of the present invention wherein an SV sensor has a pinned layer formed of a high uniaxial anisotropy ferromagnetic material, such as Co—Fe, and a keeper layer formed of a second high uniaxial anisotropy ferromagnetic material, such as Ni—Fe—Nb. During the fabrication process of the SV sensor, lapping induced tensile stress in the Co—Fe pinned layer having a high positive magnetostriction coefficient generates a stress-induced uniaxial anisotropy field in the pinned layer resulting in enhanced pinned layer magnetic saturation. This uniaxial anisotropy field is capable by itself of maintaining a substantial transverse magnetic saturation of the pinned layer even at elevated temperatures. Lapping induced tensile stress in the Ni—Fe—Nb layer having a high positive magnetostriction coefficient generates a stress-induced uniaxial anisotropy field in the keeper layer providing more uniform magnetization and therefore better flux cancellation. The high electrical resistivity of the Ni—Fe—Nb keeper layer has the further benefit of reducing sense current shunting by the keeper layer.

The total uniaxial anisotropy field, $H_K$, of ferromagnetic materials, such as Co—Fe and Ni—Fe—Nb, is the sum of the intrinsic uniaxial anisotropy field, $H_k$, and the stress induced uniaxial anisotropy field, $H_\sigma$. The intrinsic uniaxial anisotropy field, $H_k$, often simply referred to as the uniaxial anisotropy field, is normally controlled by application of a magnetic field during film growth, or by other conditions of film deposition. The stress induced uniaxial anisotropy field, $H_\sigma$, is proportional to the product of the magnetostriction coefficient, $\lambda$, of the ferromagnetic material and the tensile or compressive stress, $\sigma$, applied to the material. SV sensors formed on $Al_2O_3$ substrates are generally under tensile stress in a direction perpendicular to the ABS, so that use of materials having high positive magnetostriction coefficients will result in the high values of $H_\sigma$ desired for the pinned and keeper layers of the present invention.

In the present invention, materials having high values of saturation magnetostriction and high intrinsic uniaxial anisotropy are preferred. For the present purposes, high saturation magnetostriction is defined as $\lambda_S \geq 5 \times 10^{-6}$ and high intrinsic uniaxial anisotropy is defined as $H_k \geq 10$ Oe. Similarly, a low coercivity is defined as $H_{CE} \leq 5$ Oe.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
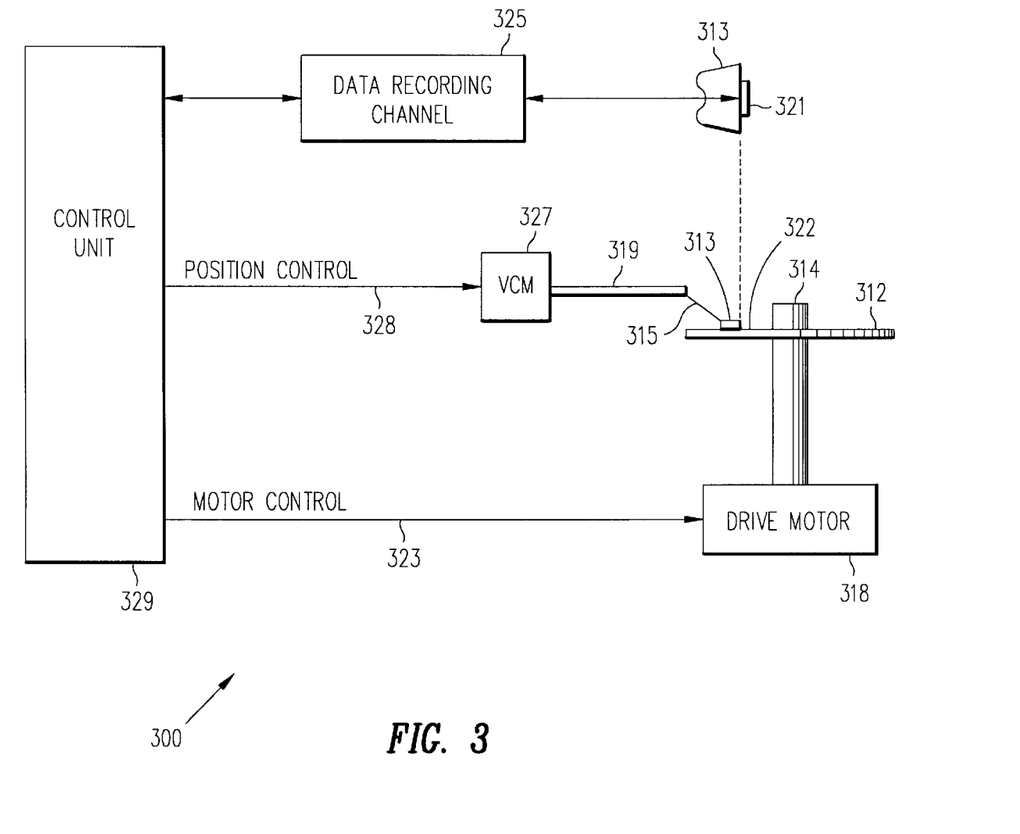
FIG. 3 is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4A:
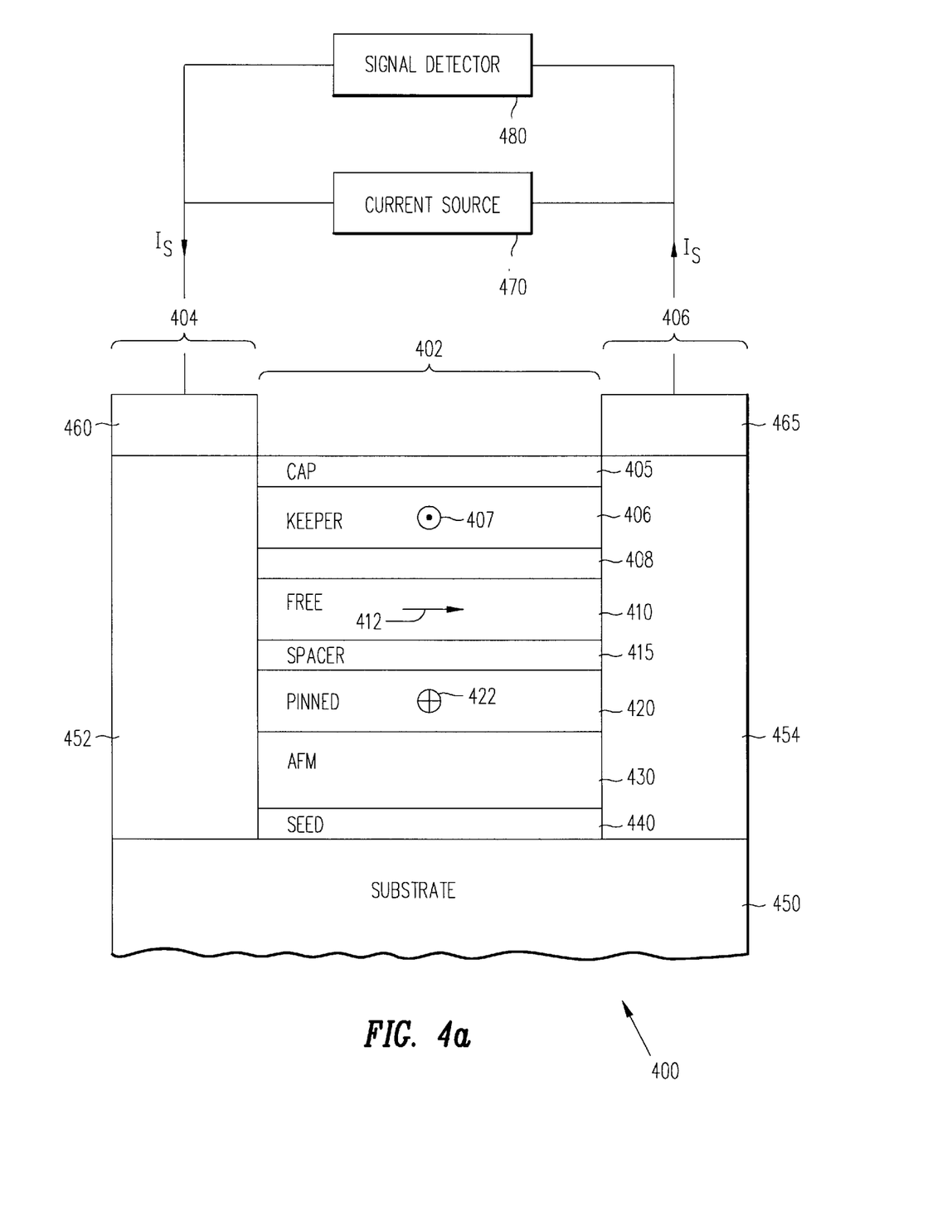
FIG. 4a is an air bearing surface view, not to scale, of the preferred embodiment of an SV sensor according to the present invention.

FIG. 4a shows an air bearing surface (ABS) view of an SV sensor 400 according to the preferred embodiment of the present invention. The SV sensor 400 comprises end regions 404 and 406 separated from each other by a central region 402. The substrate 450 can be any suitable substance, including glass, semiconductor material, or a ceramic material, such as alumina ($Al_2O_3$). The seed layer 440 is a layer deposited to modify the crystallographic texture or grain size of the subsequent layers, and may not be needed depending on the material of the subsequent layer. If used, the seed layer may be formed of tantulum (Ta), zirconium (Zr), nickel-iron (Ni—Fe), or $Al_2O_3$. An antiferromagnetic (AFM) layer 430 is deposited over seed layer 440 to the thickness at which the desired exchange properties are achieved, typically 200–500 Å. A pinned layer (pinned ferromagnetic layer) 420 is formed on AFM layer 430. The pinned layer 420 is formed of material having a high total uniaxial anisotropy, $H_K$, given by the sum of the intrinsic uniaxial anisotropy, $H_k$, and the stress-induced uniaxial anisotropy, $H_\sigma$. The total uniaxial anisotropy, $H_K$, must be in the plane of the pinned layer and perpendicular to the ABS. A free layer (free ferromagnetic layer) 410 is separated from the pinned layer 420 by a non-magnetic, electrically conducting spacer layer 415. The magnetization of the free layer 410 is preferably parallel to the ABS in the absence of an external field as indicated by the arrow 412. The magnetization of the pinned layer 420 (indicated by the tail of an arrow 422 pointing into the plane of the paper) is fixed preferably perpendicular to the ABS by an antiferromagnetic exchange interaction with AFM layer 430. A keeper layer (ferromagnetic keeper layer) 406 is separated from the free layer 410 by a non-magnetic spacer layer 408. The direction of magnetization of the keeper layer 406 (indicated by the tip of an arrow 407 pointing out of the plane of the paper) is opposite to that of the pinned layer 420 and provides flux closure for the saturated magnetization of the pinned layer 420 resulting in cancellation of the magnetostatic field from the pinned layer. A cap layer 405 formed on the keeper layer 406, completes the central region 402 of the SV sensor 400. In the present embodiment, the cap layer 405 is formed of tantalum (Ta).

The SV sensor 400 further comprises layers 452 and 454 formed in the end regions 404 and 406, respectively, for providing a longitudinal bias field to the free layer 410 to ensure a single magnetic domain state in the free layer. Lead layers 460 and 465 are also deposited in the end regions 404 and 406, respectively, to provide electrical connections for the flow of the sensing current $I_s$ from a current source 470 to the SV sensor 400. A signal detector 480 which is electrically connected to leads 460 and 465 senses the change in the resistance due to changes induced in the free layer 410 by the external magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. The signal detector 480 preferably includes a digital recording channel such as a PRML channel as is known to those skilled in the art. The signal detector 480 also includes other supporting circuitries such as a preamplifier (electrically placed between the sensor and the channel) for conditioning the sensed resistance changes as is known to those skilled in the art.

The SV sensor 400 is fabricated in a magnetron sputtering or an ion beam sputtering system to sequentially deposit the multilayer structure shown in FIG. 4. The sputter deposition process is carried out in the presence of transverse magnetic field of about 40 Oe. The AFM layer 430 formed of NiO, generally having a thickness in the range of about 200–500 Å and preferably having a thickness of about 400 Å, is directly deposited on an $Al_2O_3$ substrate layer 450 by sputtering a nickel target in the presence of a reactive gas that includes oxygen. The pinned layer 420 is formed of $Co_x$—$Fe_y$ having a thickness of about 30 Å deposited on the AFM layer 430. The preferred composition in atomic percent of the $Co_x$—$Fe_y$ material used to form the pinned layer 420 may be expressed as follows:

$x+y=100\%$, $80\% \leq x \leq 90\%$, and $10\% \leq y \leq 50\%$.

In the preferred embodiment of the present invention, the $Co_x$—$Fe_y$ composition is $Co_{80}$—$Fe_{20}$. The non-magnetic, conducting spacer layer 415 formed of Cu having a thickness of about 20 Å is deposited on the pinned layer 420. The free layer 410 formed of permalloy ($Ni_{82}$—$Fe_{18}$) having a thickness of about 55 Å is deposited on spacer layer 415.

The keeper layer 406 is separated from the free layer 410 by the non-magnetic, high resistivity spacer layer 408 formed of Ta having a thickness of about 50 Å. The keeper layer 406 is formed of $(Ni_a$—$Fe_b)_x$—$Nb_y$ having a thickness of about 60 Å. The preferred composition in atomic percent of the $(Ni_a$—$Fe_b)_x$—$Nb_y$ material used to form the keeper layer 406 may be expressed as follows:

$a+b=100\%$, $42\% \leq a \leq 71\%$, $29\% \leq b \leq 58\%$, and $x+y=100\%$, $85\% \leq x \leq 95\%$, $5\% \leq y \leq 15\%$.

In the preferred embodiment of the present invention, the $(Ni_a$—$Fe_b)_x$—$Nb_y$ composition is $(Ni_{45}$—$Fe_{55})_{93}$—$Nb_7$. The cap layer 405 formed of Ta having a thickness of about 50 Å is deposited on the keeper layer 406 completing the structure of the central portion 402 of the SV sensor 400.

The thicknesses of the Co—Fe and Ni—Fe—Nb layers in the SV sensor 400 are determined in order to attain nearly matching magnetic moments in the three layers (0.36 memu/$cm^2$ in this embodiment). However, for optimal SV sensor biasing, the Ni—Fe—Nb layer is preferably slightly thicker than the other two layers.

After the deposition of the central portion 402 is completed, the sensor is annealed for 20 minutes at 200° C. in the presence of a magnetic field of about 800 Oe oriented in the transverse direction to the ABS and is then cooled while still in the magnetic field. After the heat treatment, bilayer photoresists are applied and exposed in a photolithographic tool to mask SV sensor 400 in the central region 402, and then developed in a solvent to form an undercut. The films in the unmasked end regions 404, 406 are removed by ion milling and longitudinal bias layers 452, 454 and lead layers 460, 465 are deposited in the unmasked end regions. After all the film depositions have been completed, the fabrication process includes a lapping step to define the ABS. Removal of material during the lapping step induces a uniaxial tensile stress perpendicular to the ABS in the layers forming SV sensor 400.

Table 1 shows the relevant properties of various ferromagnetic materials used as the free layer 410, the pinned layer 420 and the keeper layer 406 in SV sensor 400. For comparison, the properties of a number of other commonly used ferromagnetic materials are included in Table 1. The properties shown in Table 1 were obtained from measurements made on experimental layers similar to those formed during fabrication of SV sensor 400. Each of the ferromagnetic materials was formed as a layer disposed between two Ta layers, each Ta layer having a thickness of 50 Å. The magnetic moment of each of the ferromagnetic layers was controlled to be approximately 0.4 memu/$cm^2$. The intrinsic uniaxial anisotropy field, often simply referred to as the uniaxial anisotropy field, is normally controlled by an applied magnetic field during film deposition or by other conditions of the deposition. The magnetic properties of the ferromagnetic layers were measured from easy-axis and hard-axis hysteresis loops as well known to the art. The electrical resistivities, $\rho_0$, and magnetostriction coefficients, $\lambda_S$, were measured by 4-point probe and cantilever bending methods, respectively, as is known to the art.

TABLE 1

Measured Properties of Ferromagnetic Films

| Attribute | $Ni_{82.5}$—$Fe_{17.5}$ | Co | $Co_{80}$—$Fe_{20}$ | $(Ni_{80}$—$Fe_{20})_{96}$—$Cr_4$ | $(Ni_{45}$—$Fe_{55})_{93}$—$Nb_7$ |
|---|---|---|---|---|---|
| $M_s$ (emu/$cm^3$) | 750 | 1360 | 1480 | 560 | 825 |
| $\sigma_0$ ($\mu\Omega$-cm) | 28 | 19 | 22 | 47 | 153 |
| $H_{CE}$ (Oe) | 2.0 | 36.4 | 4.2 | 0.8 | 2.6 |
| $H_{CH}$ (Oe) | 0.9 | 31.0 | 3.0 | 0.1 | 1.6 |
| $H_k$ (Oe) | 5.6 | 42.9 | 30.2 | 2.4 | 14.8 |
| $\lambda_s$ ($\times 10^{-6}$) | +1.0 | -3.9 | +35 | -2.2 | +26 |

Where
$M_s$ = saturation magnetization
$\sigma_0$ = electrical resistivity
$H_{CE}$ = easy axis coercivity
$H_{CH}$ = hard axis coercivity
$H_k$ = intrinsic uniaxial anisotropy
$\lambda_s$ = saturation magnetostriction coefficient From Table 1, the Co—Fe material is seen to have high saturation magnetostriction, $\lambda_S$, high intrinsic uniaxial anisotropy, $H_k$, and low coercivity, $H_{CE}$, properties well suited to achievement of high total uniaxial anisotropy while minimizing unwanted ferromagnetic coupling to the free layer 410.

From Table 1, the Ni—Fe—Nb material is seen to have high saturation magnetostriction, $\lambda_S$, high intrinsic uniaxial anisotropy, $H_k$, and low coercivity, $H_{CE}$. These magnetic properties, together with a relatively high value of electrical resistivity, $\rho_0 = 153 \, \mu\Omega$-cm, are attractive for application for the keeper layer 406.

Estimated magnitudes of the magnetostriction induced component of the total uniaxial anisotropy for the Ni—Fe, Co—Fe and Ni—Fe—Nb layers of SV sensor 400 are obtained from the experimental data of Table 1 together with data from a published study of the anisotropic stress at the ABS by Ishi et al., IEEE Transactions on Magnetics, Vol.32, pp.3389, 1996, which is incorporated herein by reference. In the study by Ishi et al., anisotropic tensile stress directed perpendicular to the ABS in the range from 100 to 300 MPa (mega Pascals) was measured in an MR head geometry similar to that of SV sensor 400. The stress induced uniaxial anisotropy field, $H_\sigma$, may be calculated using the following equation known to the art:

$$H_\sigma = 3(\lambda/M)\sigma,$$

where $\lambda$ is the magnetostriction coefficient, $\sigma$ is the anisotropic stress, and M is the magnetization.

With this equation a positive value of $H_\sigma$ is obtained for a material having a positive value of $\lambda$ under conditions of tensile stress or for a material having a negative value of $\lambda$ under conditions of compressive stress.

Figure 5:
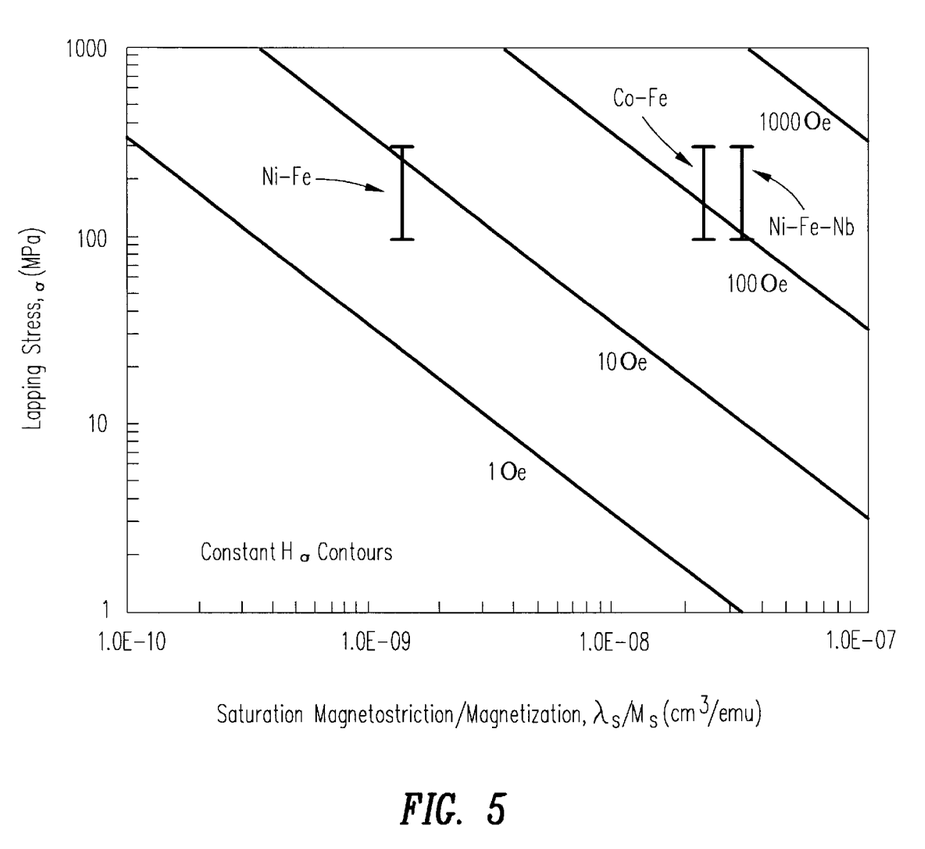
FIG. 5 is a graph of the lapping induced stress versus saturation magnetostriction/magnetization.

FIG. 5 is a graphical representation of the equation for $H_\sigma$ using the values for the saturation magnetostriction, $\lambda_S$, and the saturation magnetization, $M_S$, from Table 1 to calculate the stress induced uniaxial anisotropy fields, $H_\sigma$, in the free layer 410, pinned layer 420 and the keeper layer 406 of SV sensor 400. The data is plotted using error bars to span the uncertainty from 100 to 300 MPa in the value of the lapping stress, $\sigma$. For the $Co_{80}$—$Fe_{20}$ pinned layer material, the value of the stress induced uniaxial anisotropy field, $H_\sigma$, is calculated to be in the range from 70 Oe to 210 Oe. For the $(Ni_{45}$—$Fe_{55})_{93}$—$Nb_7$ keeper layer material, the value of the stress induced anisotropy field, $H_\sigma$, is calculated to be in the range from 95 Oe to 280 Oe. The total uniaxial anisotropy field of these materials is obtained by adding the intrinsic anisotropy field, $H_k$, from Table 1 to the is calculated stress induced anisotropy field, $H_\sigma$.

Figure 6:
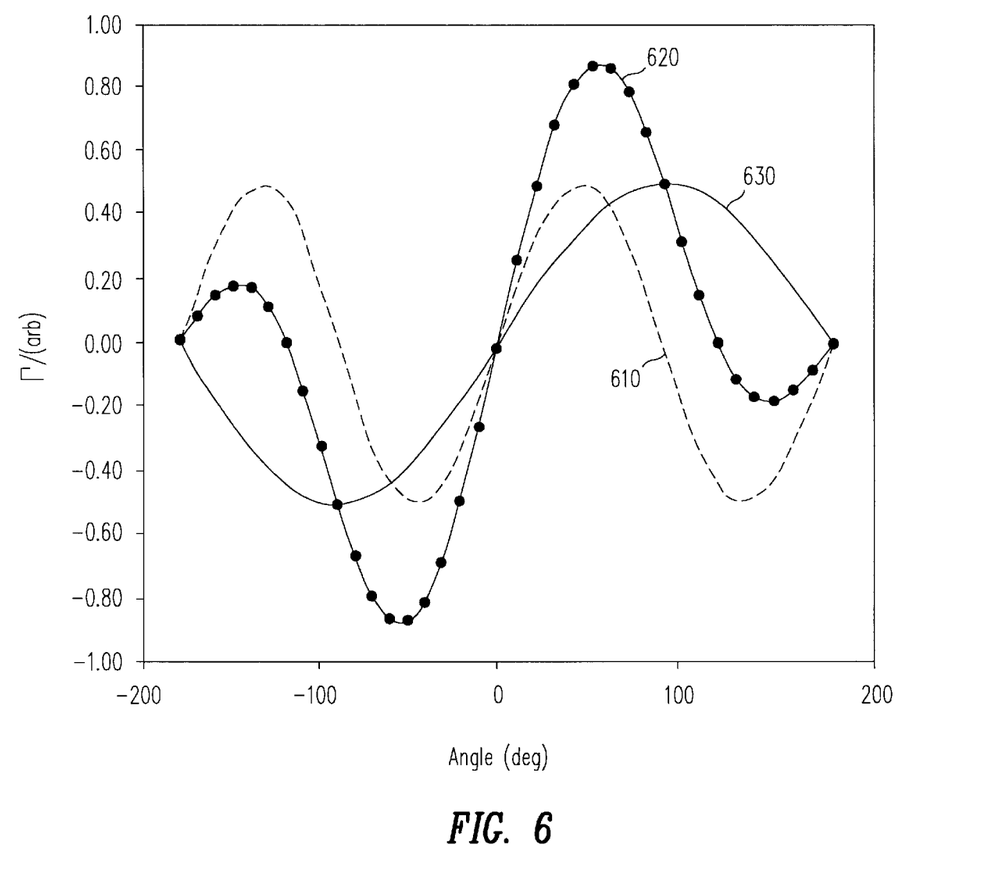
FIG. 6 is a graph of the restoring force or torque versus displacement angle for a uniaxial anisotropy field, an exchange field (unidirectional anisotropy) and for the sum of equal components of each field.

Having uniaxial anisotropy as a significant fraction of the total anisotropy of the pinned layer 420 results in a number of performance improvements. First, the pinning field at room temperature is substantially increased since the total uniaxial anisotropy field, $H_K$, adds to the unidirectional exchange field, $H_{EX}$, from the AFM layer 430. For SV sensor 400, $H_{EX}$ is $\leq 285$ Oe at room temperature and the sum of $H_\sigma$ and $H_k$ is in the range of 100 to 240 Oe, resulting in an increase of the pinning field in the range from 35% to 84%. Second, the thermal stability is improved at higher operating temperatures. The exchange field, $H_{EX}$, is determined by the relatively low blocking temperature of the NiO AFM layer (about 220° C.) while the temperature dependence of $\lambda_S$ and $H_k$ is determined by the Curie temperature of the Co—Fe pinned layer (about 700° C.). At an operating temperature of 120° C., $H_{EX}$ decreases to <180 Oe while the sum of $H_\sigma$ and $H_k$ changes little from the room temperature value. As a result an even larger improvement in the pinning field is expected at 120° C. Third, the uniaxial anisotropy components of the pinning field significantly increase the stiffness of the pinned layer magnetization over the stiffness due to the exchange field alone due to the stronger angular dependence of the restoring force for uniaxial anisotropy com-pared to the unidirectional anisotropy of the exchange field. FIG. 6 shows the increased restoring force at small displacement angles for a uniaxial anisotropy field (curve 610) and for the sum of uniaxial and exchange anisotropy fields (curve 620) compared to the smaller restoring force at small angles for the exchange anisotropy field alone (curve 630). Fourth, the stress induced uniaxial anisotropy field, $H_\sigma$, substantially reduces edge curling effects of the magnetizations of both the pinned layer 420 and the keeper layer 406. The reduced edge curling results in more uniform magnetization along the sensor height providing better flux closure. Overall, these performance improvements indicate that, even without the use of an AFM layer, the pinning field resulting from the sum of $H_\sigma$ and $H_k$ should be high enough for proper SV sensor operation.

The use of the preferred high $\lambda_S$ Ni—Fe—Nb material for the keeper layer 406 in SV sensor 400 improves sensor performance by reducing edge curl effects resulting in more uniform magnetization. More uniform magnetization of the keeper layer provides better flux cancellation and therefore more complete cancellation of demagnetizing fields at the pinned layer 420. The higher efficiency of the keeper layer material allows a thinner keeper layer to provide the desired magnetic moment required to match the magnetic moment of the pinned layer. The thinner keeper layer 406 and the higher resistivity of the Ni—Fe—Nb keeper layer material results in less current shunting by the keeper layer 406 than attained with prior keeper layer materials.

Figure 4B:
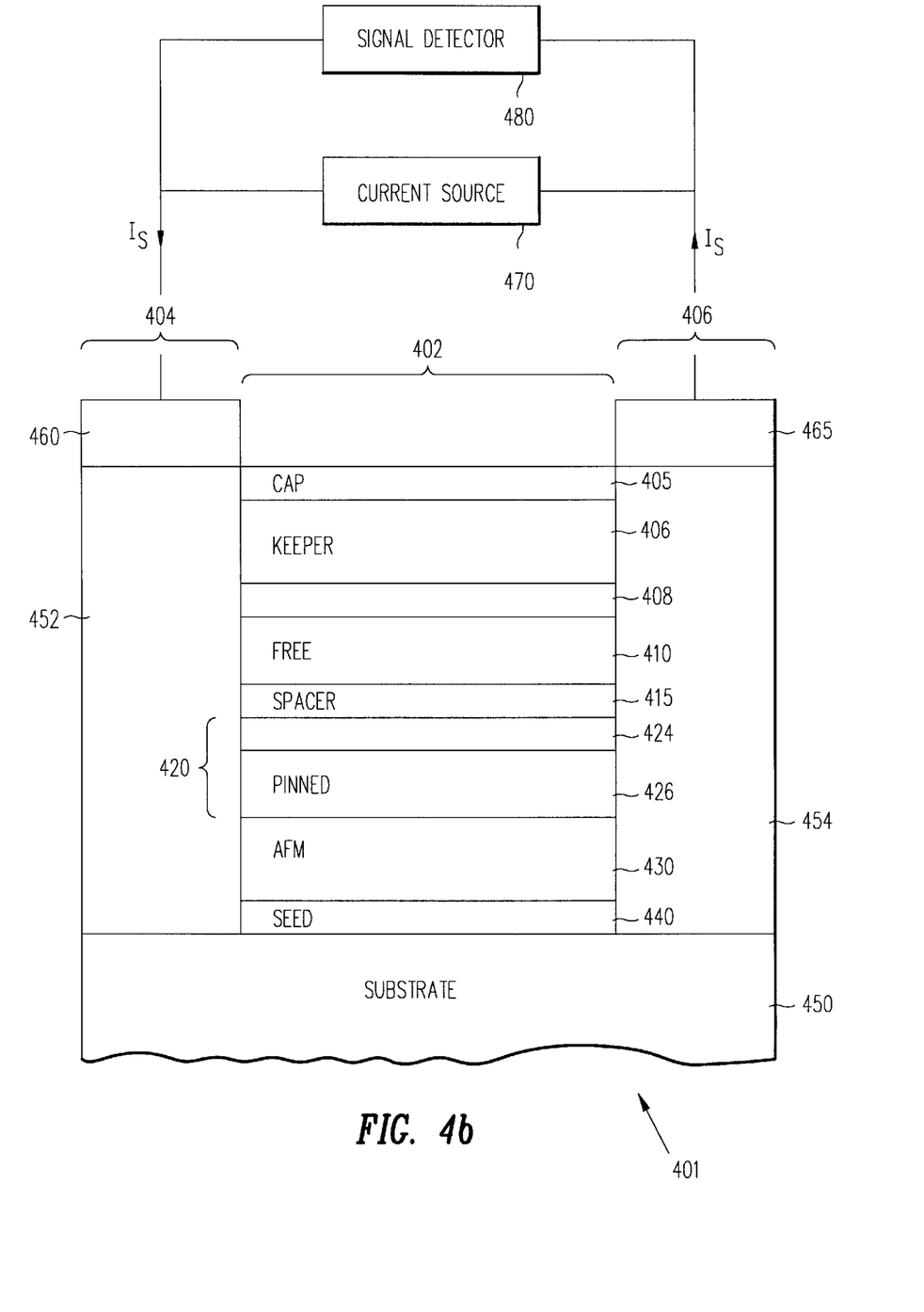
FIG. 4b is an air bearing surface view, not to scale, of an alternate embodiment of an SV sensor according to the present invention.

FIG. 4b shows an ABS view of an SV sensor 401 according to an alternate embodiment of the present invention. The SV sensor 401 is substantially the same as SV sensor 400 except that pinned layer 420 is a layered structure comprising a first ferromagnetic sub-layer 424 in contact with the spacer layer 415, and a second ferromagnetic sub-layer 426 in contact with the AFM layer 430. The first ferromagnetic sub-layer 424 is formed of Co having a thickness of about 6 Å and the second ferromagnetic sub-layer 426 is formed of Co—Fe having a thickness of about 24 Å.

Figure 7A:
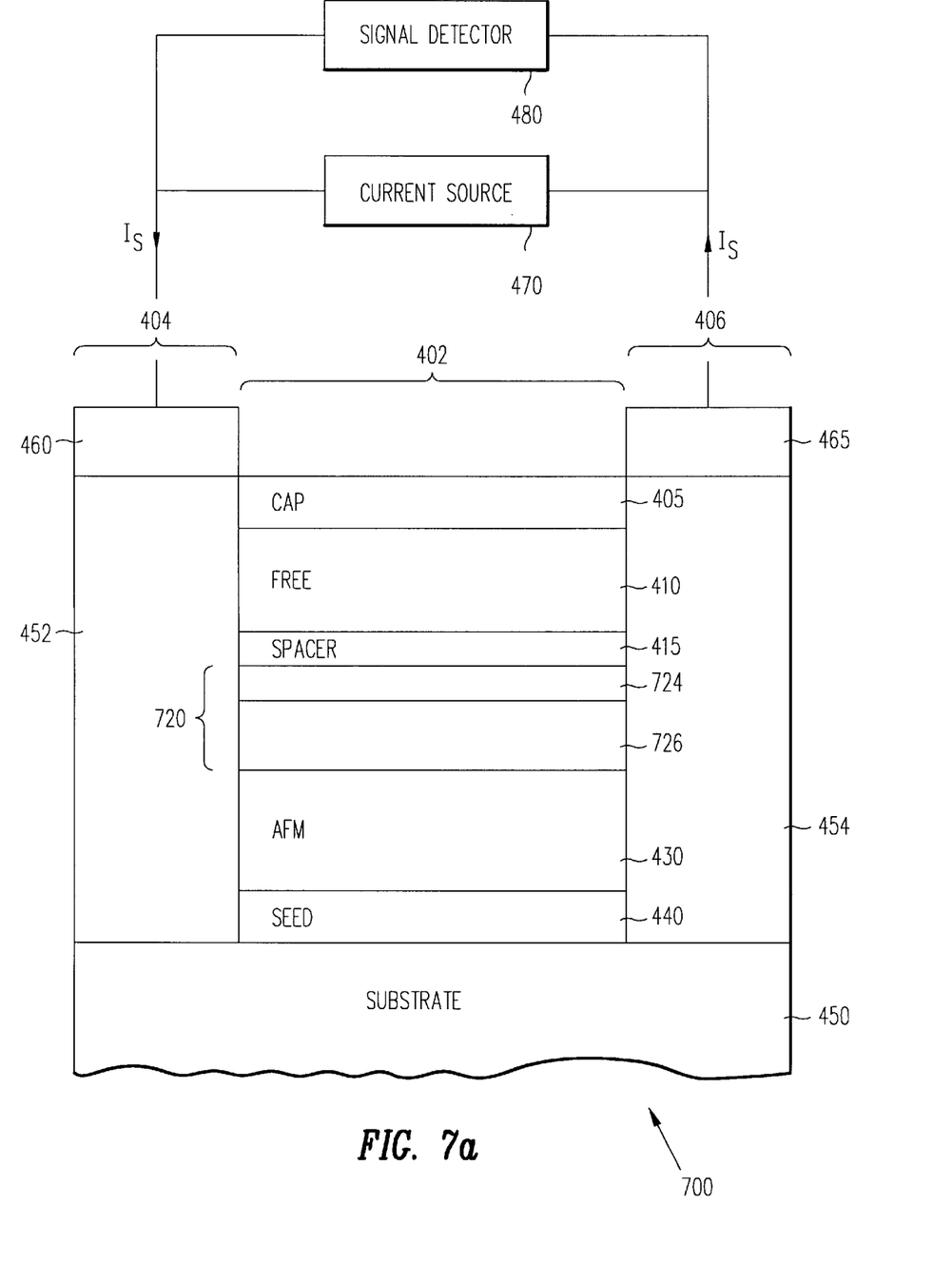
FIG. 7a is an air bearing surface view, not to scale, of another alternate embodiment of an SV sensor according to the present invention.

FIG. 7a shows an ABS view of an SV sensor 700 according to another alternate embodiment of the present invention. The SV sensor 700 comprises an AFM layer 430, a pinned layer 720, a spacer layer 415, a free layer 410, and a cap layer 405 deposited in contact with the free layer 410. The pinned layer 720 may be a single ferromagnetic layer formed of high uniaxial anisotropy material such as Co—Fe, or alternatively, a multilayer structure comprising a first ferromagnetic sub-layer 724 formed of Co having a thickness of about 6 Å in contact with the spacer layer 415, and a second ferromagnetic sub-layer 726 formed of high uniaxial anisotropy material such as Co—Fe having a thickness of about 24 Å in contact with the AFM layer 430. In this embodiment, there is no keeper layer to provide flux closure as disclosed in the preferred embodiment.

Figure 7B:
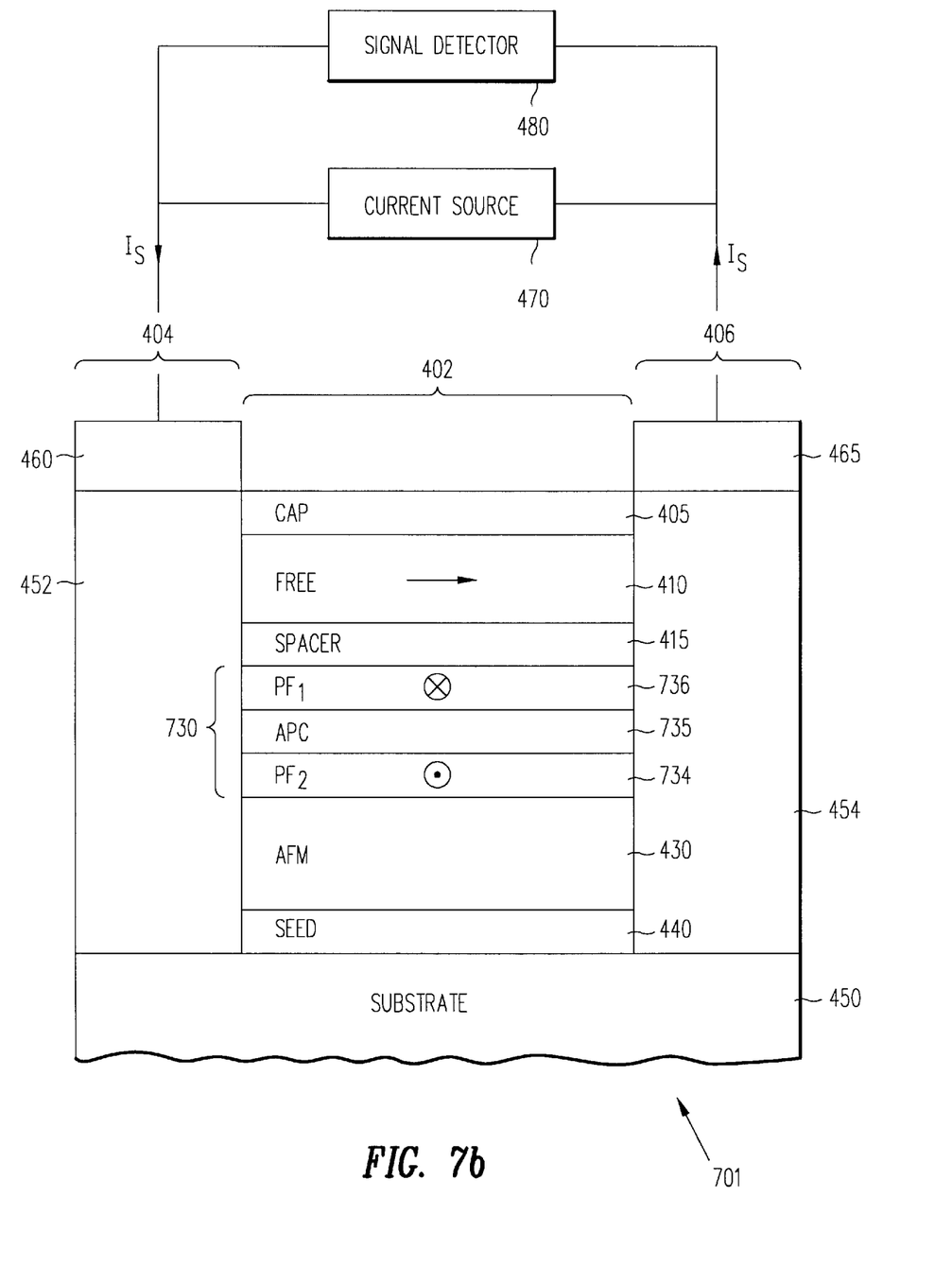
FIG. 7b is an air bearing surface view, not to scale, of yet another embodiment of an SV sensor according to the present invention.

FIG. 7b shows an ABS view of an AP-Pinned SV sensor 701 of yet another alternative embodiment of the present invention. The AP-Pinned SV sensor 701 comprises an AFM layer 430, an AP-pinned layer 730, a spacer layer 415, and a free layer 410. The AP-pinned layer 730 comprises a first ferromagnetic pinned layer 736, $FM_1$, and a second ferromagnetic pinned layer 734, $FM_2$, separated by an antiparallel coupling (APC) layer 735. The first ferromagnetic pinned layer 736 may be a single ferromagnetic layer formed of high uniaxial anisotropy material such as Co—Fe, or alternatively, a multilayer structure comprising a first ferromagnetic sub-layer 740 formed of Co having a thickness of about 6 Å in contact with the spacer layer 415, and a second ferromagnetic sub-layer 742 formed of high uniaxial anisotropy material such as Co—Fe having a thickness of about 24 Å in contact with the APC layer 735. The second ferromagnetic pinned layer 734 may be a single ferromagnetic layer formed of high uniaxial anisotropy material such as Ni—Fe—Nb, or alternatively, a multilayer structure comprising a first ferromagnetic sub-layer 740 formed of Co having a thickness of about 6 Å in contact with the APC layer 735, and a second ferromagnetic sub-layer 742 formed of high uniaxial anisotropy material such as Ni—Fe—Nb having a thickness of about 24 Å in contact with the AFM layer 430. The APC layer 735 is formed of a nonmagnetic material, such as ruthenium (Ru), that allows the first and second ferromagnetic pinned layers 736, 734 to be strongly coupled together antiferromagnetically. The preferred material for use in the second ferromagnetic pinned layer 734 is the high uniaxial anisotropy Ni—Fe—Nb material because the high electrical resistivity of this material reduces shunting of the sense current $I_s$ through this layer.

Figure 7C:
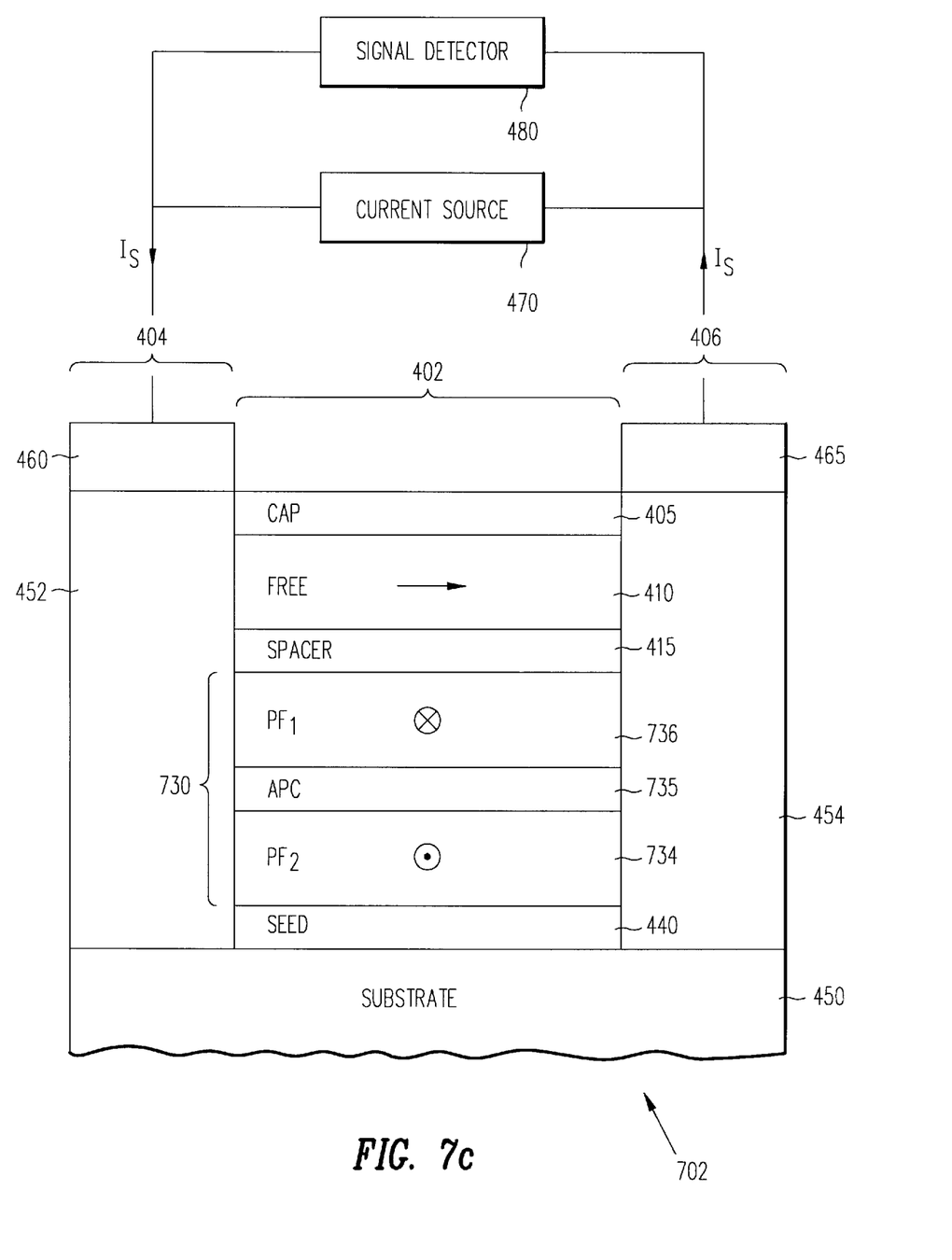
FIG. 7c is an air bearing surface view, not to scale, of a further embodiment of an SV sensor according to the present invention.

FIG. 7c shows an ABS view of an AP-Pinned SV sensor 702 of still another alternative embodiment of the present invention. The AP-Pinned SV sensor 702 comprises an AP-pinned layer 730, a spacer layer 415, and a free layer 410. The AP-pinned layer 730 comprises a first ferromagnetic pinned layer 736, $FM_1$, and a second ferromagnetic pinned layer 734, $FM_2$, separated by an antiparallel coupling (APC) layer 735. The first ferromagnetic pinned layer 736 may be a single ferromagnetic layer formed of high uniaxial anisotropy material such as Co—Fe, or alternatively, a multilayer structure comprising a first ferromagnetic sub-layer 740 formed of Co having a thickness of about 6 Å in contact with the spacer layer 415, and a second ferromagnetic sub-layer 742 formed of high uniaxial anisotropy material such as Co—Fe having a thickness of about 24 Å in contact with the APC layer 735. The second ferromagnetic pinned layer 734 may be a single ferromagnetic layer formed of high uniaxial anisotropy material such as Ni—Fe—Nb, or alternatively, a multilayer structure comprising a first ferromagnetic sub-layer 740 formed of Co having a thickness of about 6 Å in contact with the APC layer 735, and a second ferromagnetic sub-layer 742 formed of high uniaxial anisotropy material such as Ni—Fe—Nb having a thickness of about 50 Å in contact with the seed layer 440. In this embodiment, the high uniaxial anisotropy fields of the first ferromagnetic pinned layer 736 and the second ferromagnetic pinned layer 734 are sufficient to provide the pinning field for AP-Pinned SV sensor 702 without the need for an exchange field from an AFM layer.

Figure 8:
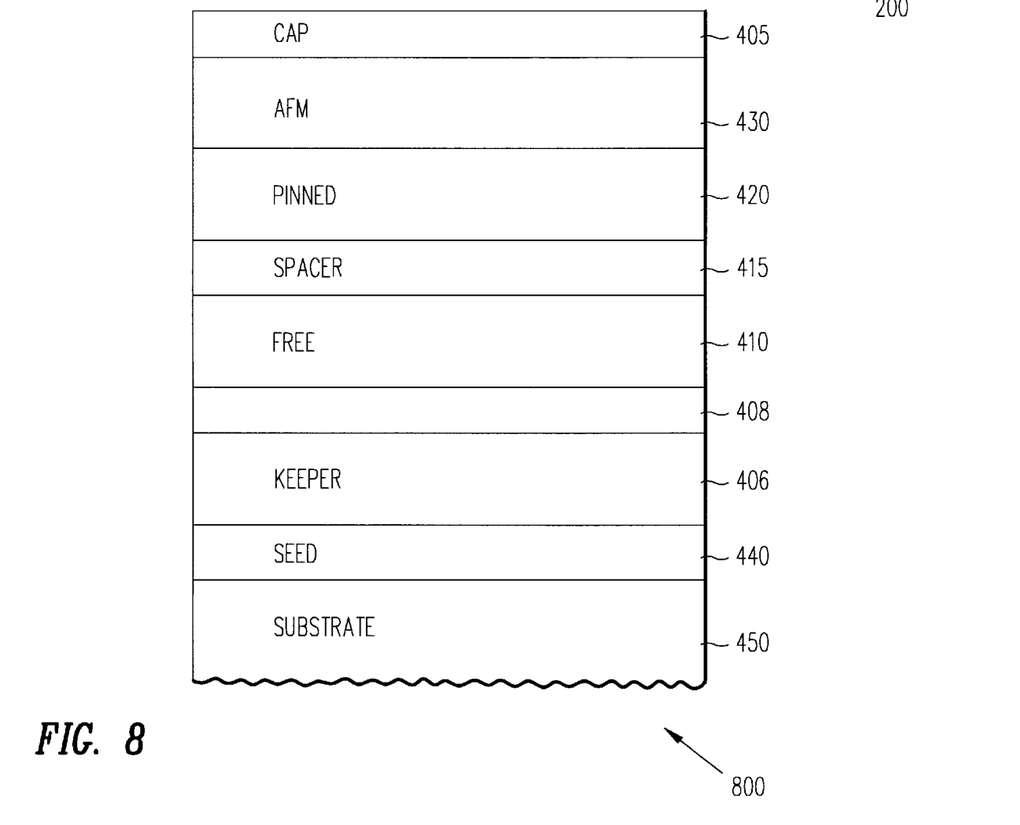
FIG. 8 is an air bearing surface view, not to scale, of yet another embodiment of an SV sensor according to the present invention.

FIG. 8 shows an ABS view of an SV sensor 800 of a further alternative embodiment of the present invention. In this embodiment, the layers forming the SV sensor 800 are deposited sequentially in reverse order to the deposition sequence used for the preferred embodiment. A keeper layer 406, if used, is deposited on the seed layer 440. The SV sensor 700 comprises a free layer 410 separated from the keeper layer 406 by a non-magnetic spacer layer 408, and a pinned layer 420 separated from the free layer 410 by a non-magnetic, electrically conducting spacer layer 415. An AFM layer 430, if used, is deposited on the pinned layer 420. The pinned layer 420 may be formed of a single layer of ferromagnetic material, or of a multilayer structure comprising a first ferromagnetic sub-layer and a second ferromagnetic sub-layer in contact with said first ferromagnetic sub-layer. Alternatively, the pinned layer 420 may be formed of an AP-pinned layer 730. If the keeper layer 406 is not used, the free layer 410 is deposited directly on the seed layer 440.

Alternative AFM layer 430 materials such as Ni—Mn, Fe—Mn, Pd—Mn, Pt—Mn, Pd—Pt—Mn, Ir—Mn, Rh—Mn, Ru—Mn and Cr—Mn—Pt may also be used to fabricate SV sensors according to the present invention.

Alternative spacer layer 415 materials such as gold and silver may also be used to fabricate SV sensors according to the present invention.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

We claim:

1. A spin valve (SV) magnetoresistive sensor, comprising:
   an antiferromagnetic (AFM) layer;
   a pinned layer, in contact with said AFM layer, said pinned layer having a high uniaxial anisotropy caused by stressing said pinned layer;
   a free layer of ferromagnetic material; and
   a spacer layer disposed between said free layer and said pinned layer.

2. The SV sensor as recited in claim 1, wherein said AFM layer is made of NiO.

3. The SV sensor as recited in claim 1, wherein said pinned layer is made of $Co_{80}$—$Fe_{20}$.

4. The SV sensor as recited in claim 1, wherein said pinned layer is made of $Co_x$—$Fe_y$ where $50\% \leq x \leq 90\%$, and $10\% \leq y \leq 50\%$, and x+y=100%.

5. The SV sensor as recited in claim 1, wherein said spacer layer is selected from a group of materials consisting of copper, gold and silver.

6. The SV sensor as recited in claim 1, wherein said free layer is made of Ni—Fe.

7. The SV sensor as recited in claim 1, further comprising:
   a keeper layer of ferromagnetic material; and
   a non-magnetic spacer layer disposed between said keeper layer and said free layer.

8. The SV sensor as recited in claim 7, wherein said keeper layer has a high uniaxial anisotropy caused by stressing said keeper layer.

9. The SV sensor as recited in claim 8, wherein said keeper layer is made of $(Ni_{45}$—$Fe_{55})_{93}$—$Nb_7$.

10. The SV sensor as recited in claim 8, wherein said keeper layer is made of $(Ni_a$—$Fe_b)_x$—$Nb_y$ where $42\% \leq a \leq 71\%$, $29\% \leq b \leq 58\%$, $85\% \leq x \leq 95\%$, $5\% \leq y \leq 15\%$, a+b=100%, and x+y=100%.

11. The SV sensor as recited in claim 1, wherein said pinned layer includes first and second ferromagnetic sub-layers where said first ferromagnetic sub-layer is made of a ferromagnetic material which is different from said second ferromagnetic sub-layer material.

12. The SV sensor as recited in claim 11, wherein said first ferromagnetic sub-layer is made of cobalt and said second ferromagnetic sub-layer is made of $Co_x$—$Fe_y$ where $50\% \leq x \leq 90\%$, and $10\% \leq y \leq 50\%$, and x+y=100%.

13. The SV sensor as recited in claim 1, wherein said AFM layer is selected from a group of materials consisting of NiO, Ni—Mn, Fe—Mn, Pd—Mn, Pt—Mn, Pd—Pt—Mn, Ir—Mn, Rh—Mn, Ru—Mn and Cr—Mn—Pt.

14. A spin valve (SV) magnetoresistive sensor, comprising:
   an antiferromagnetic (AFM) layer;
   an antiparallel (AP) pinned layer in contact with said AFM layer;

a free layer of ferromagnetic material; and a spacer layer disposed between said free layer and said AP-pinned layer;

said AP-pinned layer further comprising:

a first ferromagnetic (FM1) layer adjacent to said spacer layer, said FM1 layer having a high uniaxial anisotropy caused by stressing said FM1 layer;

a second ferromagnetic (FM2) layer in contact with said AFM layer, said FM2 layer having a high uniaxial anisotropy caused by stressing said FM2 layer; and an antiparallel coupling (APC) layer disposed between said first and second ferromagnetic layers.

15. The SV sensor as recited in claim 14, wherein said first ferromagnetic layer is made of $Co_{80}$—$Fe_{20}$, said second ferromagnetic layer is is made of $(Ni_{45}$—$Fe55)_{93}$—$Nb_7$, and said APC layer is made of ruthenium.

16. The SV sensor as recited in claim 14, wherein said first ferromagnetic layer is made of $Co_x$—$Fe_y$ where $50\% \leq x \leq 90\%$, and $10\% \leq y \leq 50\%$, and $x+y=100\%$; said second ferromagnetic layer is made of $(Ni_a$—$Fe_b)_x$—$Nb_y$ where $42\% \leq a \leq 71\%$, $29\% \leq b \leq 58\%$, $85\% \leq x \leq 95\%$, $5\% \leq y \leq 15\%$, $a+b=100\%$, and $x+y=100\%$; and said APC layer is made of ruthenium.

17. The SV sensor as recited in claim 14 wherein said AFM layer is selected from a group of materials consisting of NiO, Ni—Mn, Fe—Mn, Pd—Mn, Pt—Mn, Pd—Pt—Mn, Ir—Mn, Rh—Mn, Ru—Mn and Cr—Mn—Pt.

18. The SV sensor as recited in claim 14, wherein said first ferromagnetic layer further comprises:

a first sub-layer of cobalt adjacent to said spacer layer; and a second sub-layer adjacent to said first sub-layer, wherein said second sub-layer is made of $Co_x$—$Fe_y$ where $50\% \leq x \leq 90\%$, and $10\% \leq y \leq 50\%$, and $x+y=100\%$.

19. The SV sensor as recited in claim 14, wherein said second ferromagnetic layer further comprises:

a first sub-layer of cobalt adjacent to said APC layer; and a second sub-layer adjacent to said first sub-layer, wherein said second sub-layer is made of $(Ni_a$—$Fe_b)_x$—$Nb_y$ where $42\% \leq a \leq 71\%$, $29\% \leq b \leq 58\%$, $85\% \leq x \leq 95\%$, $5\% \leq y \leq 15\%$, $a+b=100\%$, and $x+y=100\%$.

20. A spin valve (SV) magnetoresistive sensor, comprising:

an antiferromagnetic (AFM) layer;

a pinned layer of material having positive magnetostriction in contact with said AFM layer, said pinned layer having a high uniaxial anisotropy caused by stressing said pinned layer;

a free layer of ferromagnetic material; and a spacer layer disposed between said free layer and said pinned layer.

21. A disk drive system, comprising:

a magnetic recording disk;

a spin valve (SV) magnetoresistive sensor for sensing magnetically recorded data on said magnetic recording disk, said SV sensor comprising:

an AFM layer;

a pinned layer in contact with said AFM layer, said pinned layer having a high uniaxial anisotropy caused by stressing said pinned layer;

a free layer of ferromagnetic material;

a spacer layer disposed between said free layer and said pinned layer;

a keeper layer of ferromagnetic material; and a non-magnetic spacer layer disposed between said keeper layer and said free layer;

an actuator for moving said SV sensor across the magnetic recording disk so the SV sensor may access different regions of magnetically recorded data on the magnetic recording disk; and a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

22. The disk drive system as recited in claim 21, wherein said AFM layer is selected from a group of materials consisting of NiO, Ni—Mn, Fe—Mn, Pd—Mn, Pt—Mn, Pd—Pt—Mn, Ir—Mn, Rh—Mn, Ru—Mn and Cr—Mn—Pt.

23. The disk drive system as recited in claim 21, wherein said pinned layer is made of $Co_x$—$Fe_y$ where $50\% \leq x \leq 90\%$, and $10\% \leq y \leq 50\%$, and $x+y=100\%$.

24. The disk drive system as recited in claim 21, wherein said keeper layer has a high uniaxial anisotropy caused by stressing said keeper layer.

25. The disk drive system as recited in claim 24, wherein said keeper layer is made of $(Ni_a$—$Fe_b)_x$—$Nb_y$ where $42\% \leq a \leq 71\%$, $29\% \leq b \leq 58\%$, $85\% \leq x \leq 95\%$, $5\% \leq y \leq 15\%$, $a+b=100\%$, and $x+y=100\%$.

26. A disk drive system, comprising:

a magnetic recording disk;

a spin valve (SV) magnetoresistive sensor for sensing magnetically recorded data on said magnetic recording disk, said SV sensor comprising:

an antiferromagnetic (AFM) layer;

an antiparallel pinned (AP) layer in contact with said AFM layer;

a free layer of ferromagnetic material; and a spacer layer disposed between said free layer and said AP-pinned layer;

said AP-pinned layer further comprising:

a first ferromagnetic (FM1) layer adjacent to said spacer layer, said FM1 layer having high uniaxial anisotropy caused by stressing said FM1 layer;

a second ferromagnetic (FM2) layer, in contact with said AFM layer, said FM2 layer having high uniaxial anisotropy caused by stressing said FM2 layer; and an antiparallel coupling (APC) layer disposed between said first and second ferromagnetic layers;

an actuator for moving said SV sensor across the magnetic recording disk so the SV sensor may access different regions of magnetically recorded data on the magnetic recording disk; and a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

27. The disk drive system as recited in claim 26, wherein said first ferromagnetic layer is made of $Co_x$—$Fe_y$ where $50\% \leq x \leq 90\%$, and $10\% \leq y \leq 50\%$, and $x+y=100\%$; said second ferromagnetic layer is made of $(Ni_a$—$Fe_b)_x$—$Nb_y$ where $42\% \leq a \leq 71\%$, $29\% \leq b \leq 58\%$, $85\% \leq x \leq 95\%$, $5\% \leq y \leq 15\%$, $a+b=100\%$, and $x+y=100\%$; and said APC layer is made of ruthenium.

28. The disk drive system as recited in claim 26, wherein said AFM layer is selected from a group of materials consisting of NiO, Ni—Mn, Fe—Mn, Pd—Mn, Pt—Mn, Pd—Pt—Mn, Ir—Mn, Rh—Mn, Ru—Mn and Cr—Mn—Pt.

29. A method of fabricating a spin valve (SV) magnetoresistive sensor, said SV sensor including a pinned layer having a high uniaxial anisotropy field, a free layer and a spacer layer disposed between said pinned and free layers, comprising the steps of:
   a) sputter depositing said SV sensor onto a substrate, said SV sensor including said pinned layer formed of a ferromagnetic material having a high magnetostriction coefficient; and
   b) lapping an edge of said SV sensor formed on said substrate to produce uniaxial stress in said pinned layer.

30. A method of fabricating a spin valve (SV) magnetoresistive sensor, said SV sensor including a keeper layer having a high uniaxial anisotropy field, comprising the steps of:
   a) sputter depositing said SV sensor onto a substrate, said SV sensor including said keeper layer formed of a ferromagnetic material having a high magnetostriction coefficient; and
   b) lapping an edge of said SV sensor formed on said substrate to produce uniaxial stress in said keeper layer.

* * * * *